(12) United States Patent
Ren et al.

(10) Patent No.: US 9,269,563 B2
(45) Date of Patent: Feb. 23, 2016

(54) METHODS FOR FORMING INTERCONNECT STRUCTURE UTILIZING SELECTIVE PROTECTION PROCESS FOR HARDMASK REMOVAL PROCESS

(71) Applicant: Applied Materials, Inc., Santa Clara, CA (US)

(72) Inventors: He Ren, San Jose, CA (US); Mehul B. Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/298,102

(22) Filed: Jun. 6, 2014

(65) Prior Publication Data

US 2015/0357183 A1     Dec. 10, 2015

(51) Int. Cl.
*H01L 21/02* (2006.01)
*H01L 23/00* (2006.01)
*H01L 21/033* (2006.01)

(52) U.S. Cl.
CPC ...... *H01L 21/02063* (2013.01); *H01L 21/0337* (2013.01); *H01L 23/562* (2013.01)

(58) Field of Classification Search
CPC ............... H01L 21/76808; H01L 23/53295; H01L 23/5329; H01L 21/76835; H01L 2221/1031; H01L 21/76802; H01L 21/31144; H01L 21/76832; H01L 23/53238; H01L 21/76807; H01L 21/76825; H01L 21/76813; H01L 21/02167; H01L 21/02304; H01L 21/3121; H01L 21/3148; H01L 21/76829; H01L 23/53266; H01L 21/02137; H01L 21/76804; H01L 21/76831; H01L 28/87; H01L 21/31695; H01L 23/532; H01L 21/02118; H01L 21/31058; H01L 21/02112; H01L 21/02697; H01L 21/76897; H01L 2221/1026; H01L 2221/1036; H01L 21/0274; G03F 7/0035; G03F 7/0757

See application file for complete search history.

(56) References Cited

U.S. PATENT DOCUMENTS

| | | | | |
|---|---|---|---|---|
| 6,204,168 | B1 * | 3/2001 | Naik et al. | 438/638 |
| 6,458,516 | B1 * | 10/2002 | Ye et al. | 430/317 |
| 6,677,231 | B1 * | 1/2004 | Tsai et al. | 438/624 |
| 7,691,749 | B2 * | 4/2010 | Levy et al. | 438/680 |
| 2002/0001939 | A1 * | 1/2002 | Kinoshita et al. | 438/622 |
| 2002/0142586 | A1 * | 10/2002 | Shiota | 438/633 |
| 2003/0044725 | A1 * | 3/2003 | Hsue et al. | 430/314 |
| 2009/0104782 | A1 | 4/2009 | Lu et al. | |
| 2010/0018460 | A1 | 1/2010 | Singh et al. | |
| 2010/0200993 | A1 | 8/2010 | Cui et al. | |
| 2011/0183525 | A1 * | 7/2011 | Purushothaman et al. | 438/778 |
| 2011/0291103 | A1 * | 12/2011 | Mazzillo | 257/76 |

* cited by examiner

*Primary Examiner* — Davienne Monbleau
*Assistant Examiner* — Gustavo Ramallo
(74) *Attorney, Agent, or Firm* — Patterson & Sheridan, LLP

(57) ABSTRACT

Methods and apparatuses for forming a dual damascene structure utilizing a selective protection process to protect vias and/or trenches in the dual damascene structure while removing a hardmask layer from the dual damascene structure. In one embodiment, a method for removing a patterned hardmask layer from a substrate includes forming an organic polymer material on a dual damascene structure that exposes substantially a patterned hardmask layer disposed on an upper surface of the dual damascene structure, removing the patterned hardmask layer on the substrate, and removing the organic polymer material from the substrate.

18 Claims, 6 Drawing Sheets

METHODS FOR FORMING INTERCONNECT STRUCTURE UTILIZING SELECTIVE PROTECTION PROCESS FOR HARDMASK REMOVAL PROCESS

BACKGROUND

1. Field

Embodiments described herein generally relate to methods and apparatuses for forming semiconductor devices. More particularly, embodiments described herein generally relate to methods and apparatuses for manufacturing an interconnect structure for semiconductor devices utilizing a selective protection process during a pattering process.

2. Description of the Related Art

Reliably producing nanometer and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

As the dimensions of the integrated circuit components are reduced (e.g., to nanometer dimensions), the materials used to fabricate such components must be carefully selected in order to obtain satisfactory levels of electrical performance. For example, when the distance between adjacent metal interconnects and/or the thickness of the dielectric bulk insulating material that isolates interconnects have nanometer dimensions, the potential for capacitive coupling between the metal interconnects is high. Capacitive coupling between adjacent metal interconnects may cause cross talk and/or resistance-capacitance (RC) delay which degrades the overall performance of the integrated circuit and may render the circuit inoperable. In order to minimize capacitive coupling between adjacent metal interconnects, low dielectric constant bulk insulating materials (e.g., dielectric constants less than about 4.0) are needed. Examples of low dielectric constant bulk insulating materials include silicon dioxide ($SiO_2$), silicate glass, fluorosilicate glass (FSG), and carbon doped silicon oxide (SiOC), among others.

A patterned mask, such as a photoresist layer or a hard mask layer, is commonly used to etch structures, such as gate structures, shallow trench isolation (STI), bit lines and the like, or back end dual damascene structures on a substrate. The patterned mask is conventionally fabricated by using a lithographic process to optically transfer a pattern having the desired critical dimensions to a layer of photoresist. The photoresist layer is then developed to remove undesired portions of the photoresist, thereby creating openings in the remaining photoresist.

However, the patterned mask, which is typically formed on an upper surface of the structure to be etched, often contribute an increase of the trench/via aspect ratio, which creates challenge for the metal gap filling process. As such, it is often desired to remove the patterned mask from the substrate prior to the metallization process so as to lower the aspect ratio of the vias/trenches to facilitate metal filling into the vias/trenches during the metallization process. Conventionally, dry etching or wet etching process can both be utilized to remove the patterned mask. However, conventional processes often adversely damage sidewalls or features in the interconnect structure, resulting in line collapse or profile deformation.

Damage caused to the structure may result in inaccurate critical dimension of the feature formed on the substrate may result in poor electrical properties of the device. Poor electrical properties of the device may impact not only the electrical performance of the devices, but also on the integration of the interconnection structure, including insulating materials and conductive materials, which may eventually lead to device failure.

Thus, there is a need for improved methods to selectively control and protect certain areas of the structures on a substrate from damage during a patterned mask removal process.

SUMMARY

Methods and apparatuses for forming a dual damascene structure utilizing a selective protection process to protect vias and/or trenches in the dual damascene structure while removing a hardmask layer from the dual damascene structure are provided. In one embodiment, a method for removing a patterned hardmask layer from a substrate includes forming an organic polymer material on a dual damascene structure that exposes substantially a patterned hardmask layer disposed on an upper surface of the dual damascene structure, removing the patterned hardmask layer on the substrate, and removing the organic polymer material from the substrate.

In another embodiment, a method for removing a patterned hardmask layer from a substrate includes disposing an organic material layer in a structure defining an uneven top surface of a substrate, the organic material layer filling the structure to provide a substantially planar surface predominantly exposing a patterned hardmask layer on the substrate, removing the patterned hardmask layer from the substrate, and thermally treating the substrate after the patterned hardmask layer is removed.

In yet another embodiment, a method for removing a patterned hardmask layer from a substrate includes selectively covering a first portion of a structure disposed on a substrate by an organic polymer material, and exposing a second portion of the structure on the substrate, wherein the second portion includes a patterned hardmask layer disposed on the structure, removing the patterned hardmask layer from the structure while the organic polymer material remains covering the first portion of the structure, and UV radiation treating the substrate to remove the organic polymer material from the structure.

BRIEF DESCRIPTION OF THE DRAWINGS

So that the manner in which the above recited features of the embodiments can be understood in detail, a more particular description of the embodiments, briefly summarized above, can be had by reference to embodiments, some of which are illustrated in the appended drawings. It is to be noted, however, that the appended drawings illustrate only examples of the embodiments and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods and apparatuses for manufacturing a dual damascene structure utilizing a selective protection process to protect vias/trenches in the dual damascene while etching a patterned hardmask layer are provided. The selective protection process is utilized by forming an organic polymer material in trenches/vias in the dual damascene structure so as to protect profile, including sidewalls and bottoms, of the trenches/vias in the dual damascene structure, from being attacked or damaged during the hardmask layer removal process. After the etching process, the organic polymer layer may be removed from the substrate utilizing a UV thermal treatment process. By doing so, the profile and inner structures in the dual damascene structure may be protected and prevented from damage during the hardmask layer removal process, so to reduce interconnection manufacturing defects, including undercuts, or low-K dielectric material damage, which are often caused during the conventional hardmask layer etching process.

Figure 1:
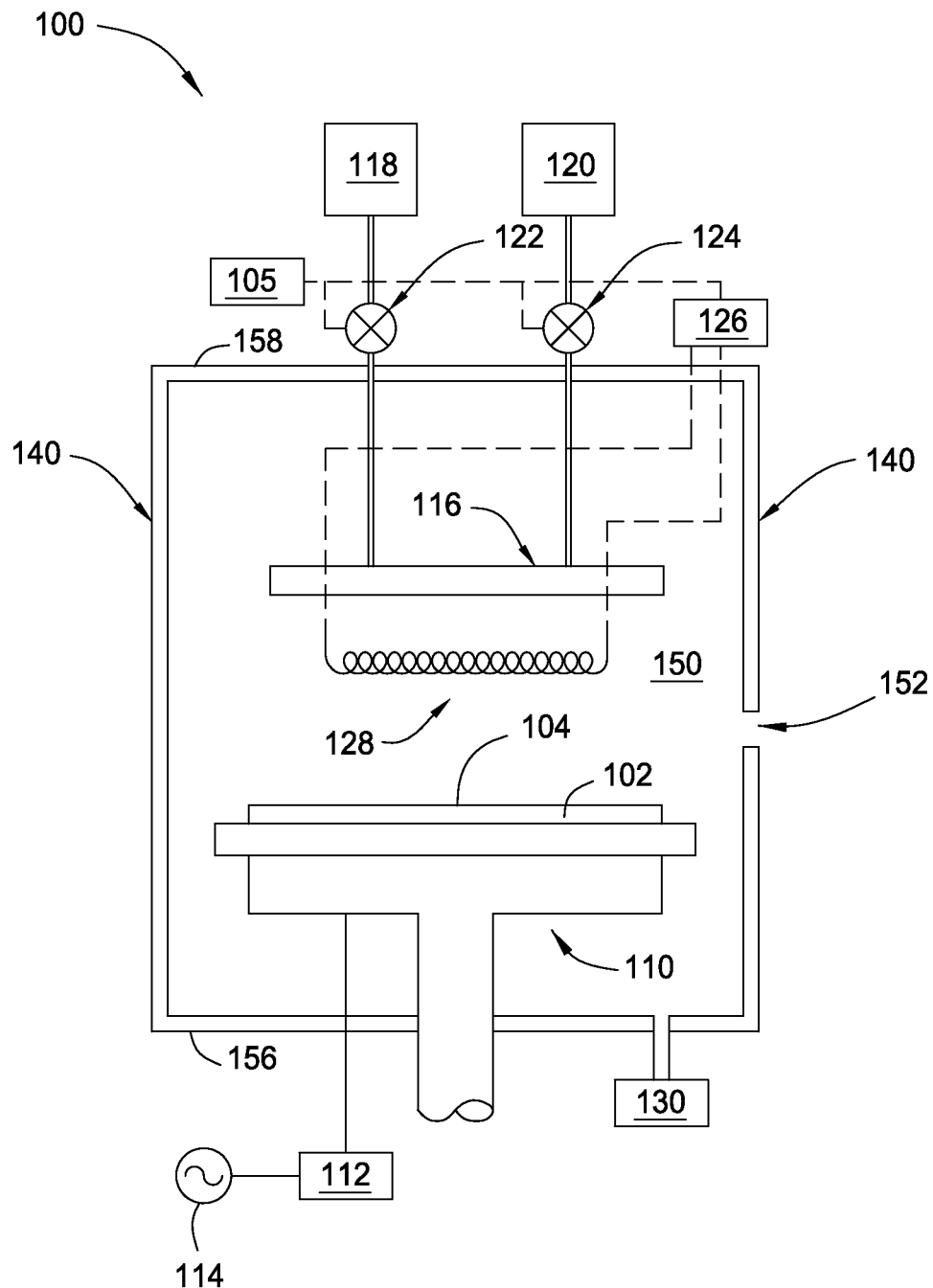
FIG. 1 is a cross section view of an illustrative processing chamber in which embodiments of the disclosure may be practiced.

FIG. 1 shows a schematic side view of one embodiment of a processing chamber 100 for depositing an organic material on a substrate 102. The processing chamber 100 may be a hot wire chemical vapor deposition (HWCVD) processing chamber that may be utilized to perform a hot wire chemical vapor deposition process (HWCVD), also known as hot filament CVD (HFCVD).

The processing chamber 100 includes chamber sidewalls 140 defining an interior processing region 150. The chamber sidewalls 140 may include a substrate transfer port 152 to facilitate transferring the substrate 102 into and out of the processing chamber 100. In one embodiment, a pumping device 130 is coupled to a bottom 156 of the processing chamber 100 to evacuate and control the pressure therein. The pumping device 130 may be a conventional roughing pump, roots blower, turbo pump or other similar device that is adapted control the pressure in the interior processing region 150. In one embodiment, the pressure level of the processing region 150 of the processing chamber 100 may be maintained at less than about 760 Torr. In one embodiment, the pressure level of the processing region 150 of the chamber 100 may be maintained at about 1 Torr or less. In another embodiment, the pressure level within the processing region 150 may be maintained at about $10^{-3}$ Torr or less. In yet another embodiment, the pressure level within the processing region 150 may be maintained at about $10^{-3}$ Torr to about $10^{-7}$ Torr.

A substrate support assembly 110 is disposed above the bottom 156 of the processing chamber 100 and receives the substrate 102 during deposition. In one embodiment, the substrate support assembly 110 may be biased by an RF power supply 114 through a match circuit 112. The RF power supply 114 may provide a RF bias power which attracts plasma ions from reactive precursors supplied in the processing region 150 to the substrate 102 positioned pm the substrate support assembly 110. The RF power supply 114 may cycle on and off, or pulse, during processing of the substrate 102.

A showerhead 116 is disposed below a top 158 of the processing chamber 100 and is spaced above a surface 104 of the substrate 102. One or more precursor sources 118, 120 may supply reactive species via valves 122, 124, respectively through the showerhead 116 to the processing region 150. The valves 122, 124 are controlled by signals received from a support circuits from a system controller 105.

Hot wire chemical vapor deposition (HWCVD) process utilizes a hot filament, e.g., a hot wire to chemically decompose precursor sources. A resistive wire 128 is placed below the showerhead 116 in close proximity to the surface of the substrate 102 to assist execution of a chemical vapor deposition process. The resistive wire 128, also called a hot filament, is used to decompose the precursor sources. Electrical current is supplied to the wire 128 by a power supply 126, based on signals received from the support circuits of the system controller 105. The electrical current heats the wire 128 to evaporate the reactive precursors from the precursor sources 118, 120, which thermally decomposes and deposits materials on the substrate 102.

During the hot wire chemical vapor deposition (HWCVD) process, hot filament (usually tungsten or tantalum) from the wire 128 is heated to "crack" the reactive species (e.g., polymer or organic materials) into atomic radicals. The hot filament is typically maintained at a surface temperature between about 500 degrees and about 2000 degrees Celsius. The reactive species, after passing across the surface of the hot filament, i.e., the hot wires 128, are transported through the processing region 150 to the substrate 102. Low pressure within the processing region 150 enables a high deposition rate without gas-phase particle formation.

Figure 2:
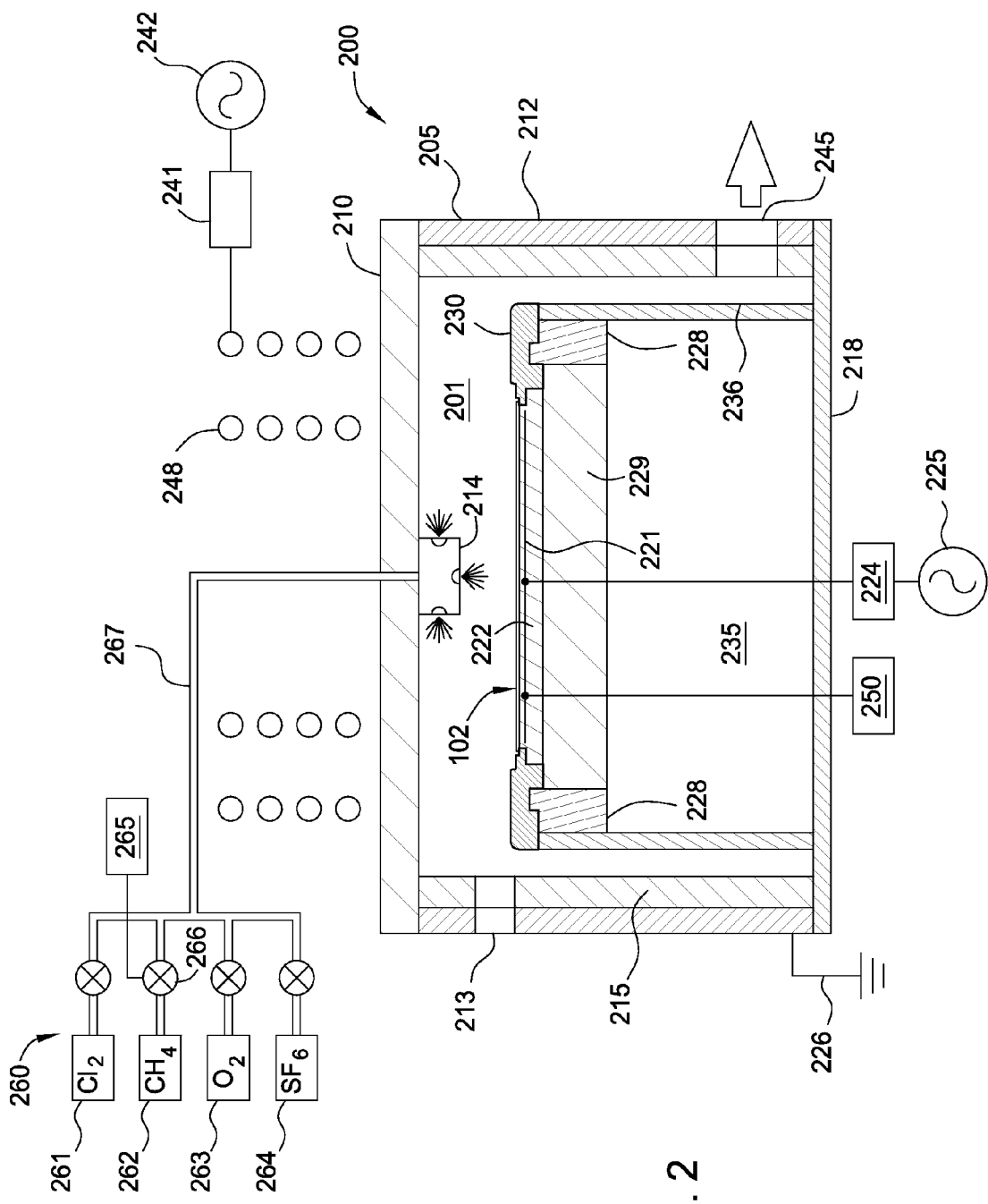
FIG. 2 is a cross-sectional view of an etching processing chamber in which embodiments of the disclosure may be practiced.

FIG. 2 is a simplified cutaway view for an exemplary etching processing chamber 200 for etching a hardmask layer, such as a metal containing layer. The exemplary etching processing chamber 200 is suitable for removing one or more film layers from the substrate 102. One example of the process chamber that may be adapted to benefit from the disclosure is an AdvantEdge Mesa Etch processing chamber, available from Applied Materials, Inc., located in Santa Clara, Calif. It is contemplated that other process chambers, including those from other manufactures, may be adapted to practice embodiments of the disclosure.

The etching processing chamber 200 includes a chamber body 205 having a chamber volume 201 defined therein. The chamber body 205 has sidewalls 212 and a bottom 218 which are coupled to ground 226. The sidewalls 212 have a protective inner liner 215 to extend the time between maintenance cycles of the etching processing chamber 200. The dimensions of the chamber body 205 and related components of the etching processing chamber 200 are not limited and generally are proportionally larger than the size of the substrate 102 to be processed therein. Examples of substrate sizes include 200 mm diameter, 250 mm diameter, 300 mm diameter and 450 mm diameter, among others.

Figure 4:
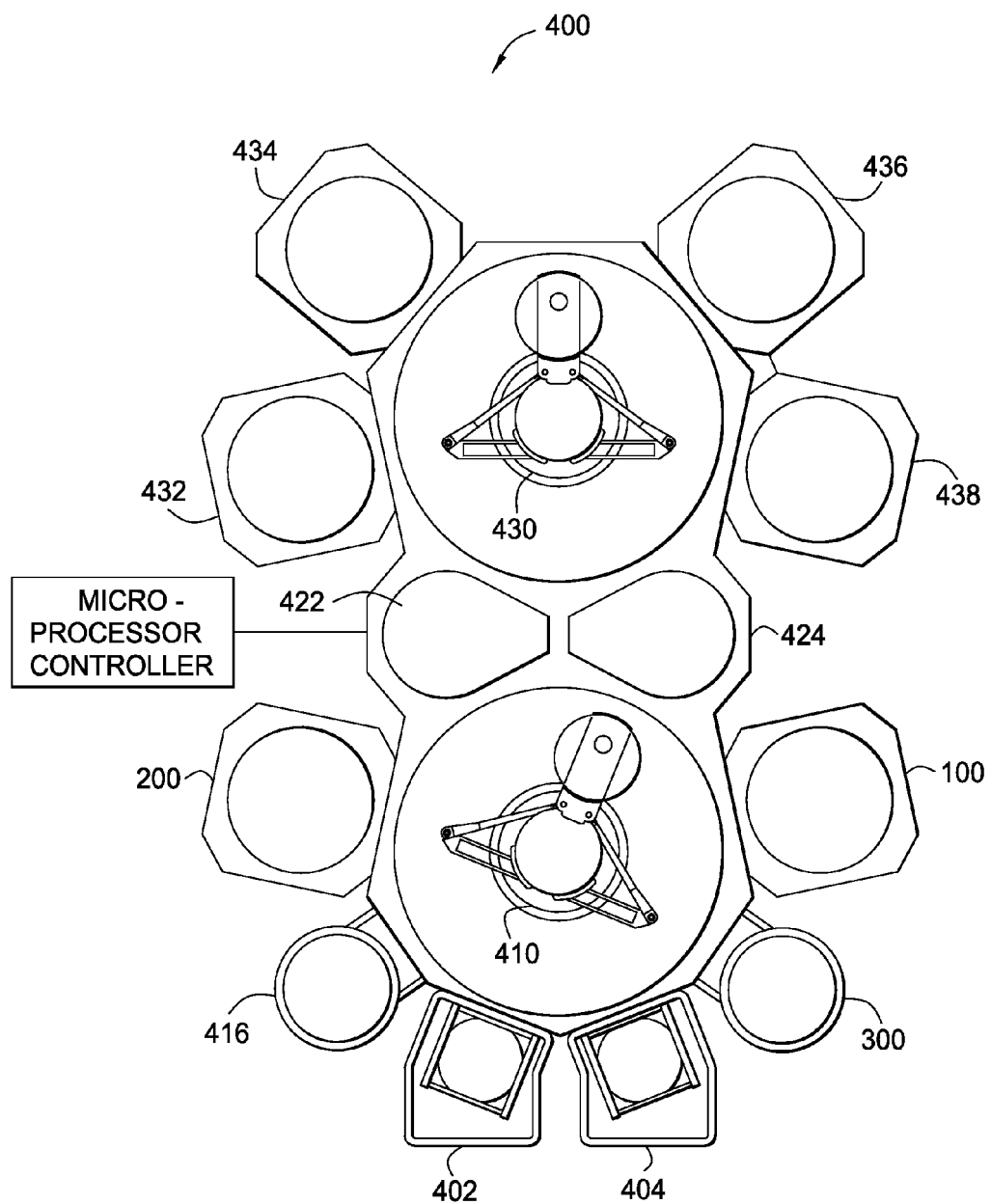
FIG. 4 is a top view of an illustrative multi-chamber processing system.

The chamber body 205 supports a chamber lid assembly 210 to enclose the chamber volume 201. The chamber body 205 may be fabricated from aluminum or other suitable materials. A substrate access port 213 is formed through the sidewalls 212 of the chamber body 205, facilitating the transfer of the substrate 102 into and out of the etching processing chamber 200. The substrate access port 213 may be coupled to a transfer chamber and/or other chambers of a substrate processing system (one example of which is shown in FIG. 4).

A pumping port 245 is formed through the sidewalls 212 of the chamber body 205 and connected to the chamber volume 201. A pumping device (not shown) is coupled through the pumping port 245 to the chamber volume 201 to evacuate and control the pressure therein. The pumping device may include one or more pumps and throttle valves.

A gas panel 260 is coupled by a gas line 267 to the chamber body 205 to supply process gases into the chamber volume 201. The gas panel 260 may include one or more process gas sources 261, 262, 263, 264 and may additionally include inert gases, non-reactive gases, and reactive gases, if desired. Examples of process gases that may be provided by the gas panel 260 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 266 control the flow of the process gases from the sources 261, 262, 263, 264 from the gas panel 260 and are managed by a controller 265. The flow of the gases supplied to the chamber body 205 from the gas panel 260 may include combinations of the gases.

The chamber lid assembly 210 may include a nozzle 214. The nozzle 214 has one or more ports for introducing the process gases from the sources 261, 262, 264, 263 of the gas panel 260 into the chamber volume 201. After the process gases are introduced into the etching processing chamber 200, the gases are energized to form plasma. An antenna 248, such as one or more inductor coils, may be provided adjacent to the etching processing chamber 200. An antenna power supply 242 may power the antenna 248 through a match circuit 241 to inductively couple energy, such as RF energy, to the process gas to maintain a plasma formed from the process gas in the chamber volume 201 of the etching processing chamber 200. Alternatively, or in addition to the antenna power supply 242, process electrodes below the substrate 102 and/or above the substrate 102 may be used to capacitively couple RF power to the process gases to maintain the plasma within the chamber volume 201. The operation of the antenna power supply 242 may be controlled by a controller, such as controller 265, that also controls the operation of other components in the etching processing chamber 200.

A substrate support pedestal 235 is disposed in the chamber volume 201 to support the substrate 102 during processing. The substrate support pedestal 235 may include an electro-static chuck 222 for holding the substrate 102 during processing. The electro-static chuck (ESC) 222 uses the electro-static attraction to hold the substrate 102 to the substrate support pedestal 235. The ESC 222 includes an electrode 221 powered by a power source 255. The electrode 221 is embedded in the ESC 222 within a dielectric body. The power source 255 may also include a system controller for controlling the operation of the electrode 221 by directing a DC current to the electrode 221 for chucking and de-chucking the substrate 102.

Furthermore, the electrode 221 may further be coupled to an RF power supply 225 integrated with a match circuit 224. The RF power supply 225 may provide a RF bias voltage of about 200 volts to about 2000 volts to the electrode 221. Furthermore, the RF power supply 225 provides a bias which attracts plasma ions, formed by the process gases in the chamber volume 201, to the ESC 222 and substrate 102 positioned thereon. The RF power supply 225 may cycle on and off, or pulse, during processing of the substrate 102. The ESC 222 has an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the etching processing chamber 200.

The ESC 222 may include heaters disposed therein and connected to a power source (not shown), for heating the substrate, while a cooling base 229 supporting the ESC 222 may include conduits for circulating a heat transfer fluid to maintain a temperature of the ESC 222 and substrate 102 disposed thereon. The ESC 222 is configured to perform in the temperature range required by the thermal budget of the device being fabricated on the substrate 102. For example, the ESC 222 may be configured to maintain the substrate 102 at a temperature of about minus about 25 degrees Celsius to about 500 degrees Celsius for certain embodiments.

The cooling base 229 is provided to assist in controlling the temperature of the substrate 102. To mitigate process drift over time, the temperature of the substrate 102 may be maintained substantially constant by the cooling base 229 throughout the process of etching the substrate 102 in the etching processing chamber 200. In one embodiment, the temperature of the substrate 102 is maintained throughout subsequent etch processes at about 70 to 90 degrees Celsius.

A cover ring 230 is disposed on the ESC 222 and along the periphery of the substrate support pedestal 235. The cover ring 230 is configured to confine etching gases to a desired portion of the exposed top surface of the substrate 102, while shielding the top surface of the substrate support pedestal 235 from the plasma environment inside the etching processing chamber 200. Lift pins (not shown) are selectively moved through the substrate support pedestal 235 to lift the substrate 102 above the substrate support pedestal 235 to facilitate access to the substrate 102 by a transfer robot (not shown) or other suitable transfer mechanism.

The controller 265 may be utilized to control the process sequence, regulating the gas flows from the gas panel 260 into the etching processing chamber 200 and other process parameters. Software routines, when executed by the CPU, transform the CPU into a specific purpose computer (controller) that controls the etching processing chamber 200 such that the processes are performed. The software routines may also be stored and/or executed by a second controller (not shown) that is co-located with the etching processing chamber 200.

The substrate 102 has various film layers disposed thereon which may include at least one hardmask layer, such as a metal containing layer, a metal dielectric layer, or a dielectric layer. The various film layers may require etch recipes which are unique for the different compositions of each of the other film layers disposed on the substrate 102. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etching processing chamber or across several etch processing chambers. Each etching processing chamber may be configured to etch with one or more of the etch recipes. In one embodiment, the etching processing chamber 200 is configured to at least etch a hardmask layer to form an interconnection structure, such as a dual damascene structure. For processing parameters provided herein, the etching processing chamber 200 is configured to process a 300 mm diameter substrate, i.e., a substrate having a plan area of about 0.0707 $m^2$, or a 450 mm diameter substrate. The process parameters, such as flow and power, may generally be scaled proportionally with the change in the chamber volume or substrate plan area.

Figure 3:
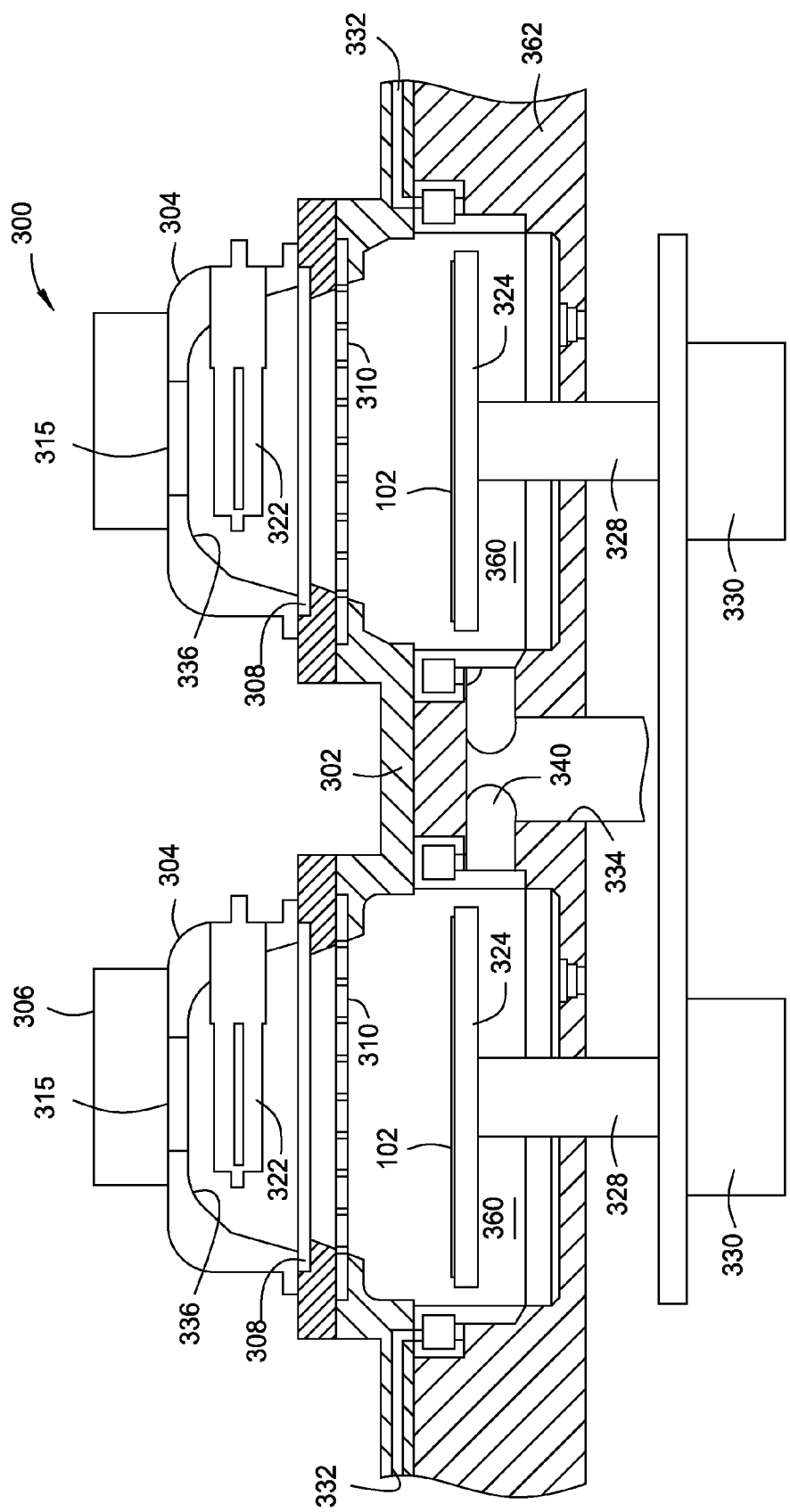
FIG. 3 is a cross-sectional view of a UV thermal treatment chamber in which embodiments of the disclosure may be practiced.

FIG. 3 illustrates a cross-sectional view of a twin volume processing system 300. The processing system 300 illustrates an exemplary embodiment of a 300 mm, or 450 mm PRODUCER® processing system, commercially available from Applied Materials, Inc., of Santa Clara, Calif. The embodiments described herein may also be advantageously employed on PRODUCER® NANOCURE™ and PRODUCER® ONYX™ systems, both available from Applied Materials, Inc., of Santa Clara, Calif., or other suitably adapted processing systems, including those from other manufacturers.

The processing system 300 provides two separate and adjacent processing regions in a chamber body for processing the substrates. The processing system 300 has a lid 302, housings 304 and power sources 306. Each of the housings 304 cover a respective one of two UV lamps 322 disposed respectively above two processing regions 160 defined within the body 362. Each of the processing regions 360 includes a heating substrate support, such as substrate support 324, for supporting a substrate 102 within the processing regions 360. The UV lamps 322 emit UV light that is directed through the windows 308 and showerheads 310 onto each substrate located within each processing region. The substrate supports 324 can be made from ceramic or metal such as aluminum. The substrate supports 324 may couple to stems 328 that extend through a bottom of the body 362 and are operated by drive systems 330 to move the substrate supports 324 in the processing regions 360 toward and away from the UV lamps 322. The drive systems 330 can also rotate and/or translate the substrate supports 324 during curing to further enhance uniformity of substrate illumination. The exemplary tandem processing system 300 may be incorporated into a processing system, such as a Producer™ processing system, commercially available from Applied Materials, Inc., of Santa Clara, Calif.

The UV lamps 322 can be an array of light emitting diodes or bulbs utilizing any suitable UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV lamps 322 are a source of ultraviolet radiation, and may transmit a broad spectral range of wavelengths of UV and infrared (IR) radiation.

The UV lamps 322 may emit light across a broad band of wavelengths from 170 nm to 400 nm. The gases selected for use within the UV lamp 322 can determine the wavelengths emitted. UV light emitted from the UV lamps 322 enters the processing regions 360 by passing through windows 308 and gas distribution showerheads 310 disposed in apertures in the lid 302. The windows 308 may be made of an OH free synthetic quartz glass and have sufficient thickness to maintain vacuum without cracking. The windows 308 may be fused silica that transmits UV light down to approximately 150 nm. The showerheads 310 may be made of transparent materials such as quartz or sapphire and positioned between the windows 308 and the substrate support 324. Since the lid 302 seals to the body 362 and the windows 308 are sealed to the lid 302, the processing regions 360 provide volumes capable of maintaining pressures from approximately 1 Torr to approximately 650 Torr. Processing or cleaning gases may enter the processing regions 360 via a respective one of two inlet passages 332. The processing or cleaning gases then exit the processing regions 360 via a common outlet port 334.

Each of the housings 304 includes an aperture 315 adjacent the power sources 306. The housings 304 may include an interior parabolic surface defined by a cast quartz lining 336 coated with a dichroic film. The dichroic film usually constitutes a periodic multilayer film composed of diverse dielectric materials having alternating high and low refractive index. Therefore, the quartz linings 336 may transmit infrared light and reflect UV light emitted from the UV lamp 322. The quartz linings 336 may be adjusted to better suit each process or task by moving and changing the shape of the interior parabolic surface.

FIG. 4 is a schematic top-view diagram of an illustrative multi-chamber processing system 400 that can be adapted to perform processes as disclosed herein having the processing chambers 100, 200, 300 coupled thereto. The system 400 can include one or more load lock chambers 402, 404 for transferring substrates into and out of the system 400. Typically, since the system 400 is under vacuum, the load lock chambers 402, 404 can "pump down" the substrates being introduced into the system 400. A first robot 410 can transfer the substrates between the load lock chambers 402, 404, and a first set of one or more processing chambers 100, 200, 300, 416 (four are shown). Each processing chamber 100, 200, 300, 416 is configured to perform at least one of substrate processing operation, such as an etching process, cyclical layer deposition (CLD), atomic layer deposition (ALD), chemical vapor deposition (CVD), hot wire chemical vapor deposition (HWCVD), physical vapor deposition (PVD), UV curing, UV heating, UV treatment, degas, orientation and other substrate processes. The position of the processing chamber 100 utilized to form a polymer layer, processing chamber 200 utilized to perform the etching process, and the UV processing system 300 utilized to perform a UV thermal treatment process, relative to the other chambers 416 is for illustration, and the position of the processing chambers 100, 200, 300 may be optionally in any order related to the processing chamber 416 as desired.

The first robot 410 can also transfer substrates to/from one or more transfer chambers 422, 424. The transfer chambers 422, 424 can be used to maintain ultra-high vacuum conditions while allowing substrates to be transferred within the system 400. A second robot 430 can transfer the substrates between the transfer chambers 422, 424 and a second set of one or more processing chambers 432, 434, 436, 438. Similar to processing chambers 100, 200, 300, 416, the processing chambers 432, 434, 436, 438 can be configured to perform a variety of substrate processing operations including the dry etch processes described herein any other suitable process including deposition, etching, UV treatment, pre-clean, degas, and orientation, for example. Any of the processing chambers 100, 200, 300, 416, 432, 434, 436, 438 can be removed from the system 400 if not necessary for a particular process performed by the system 400.

Figure 5:
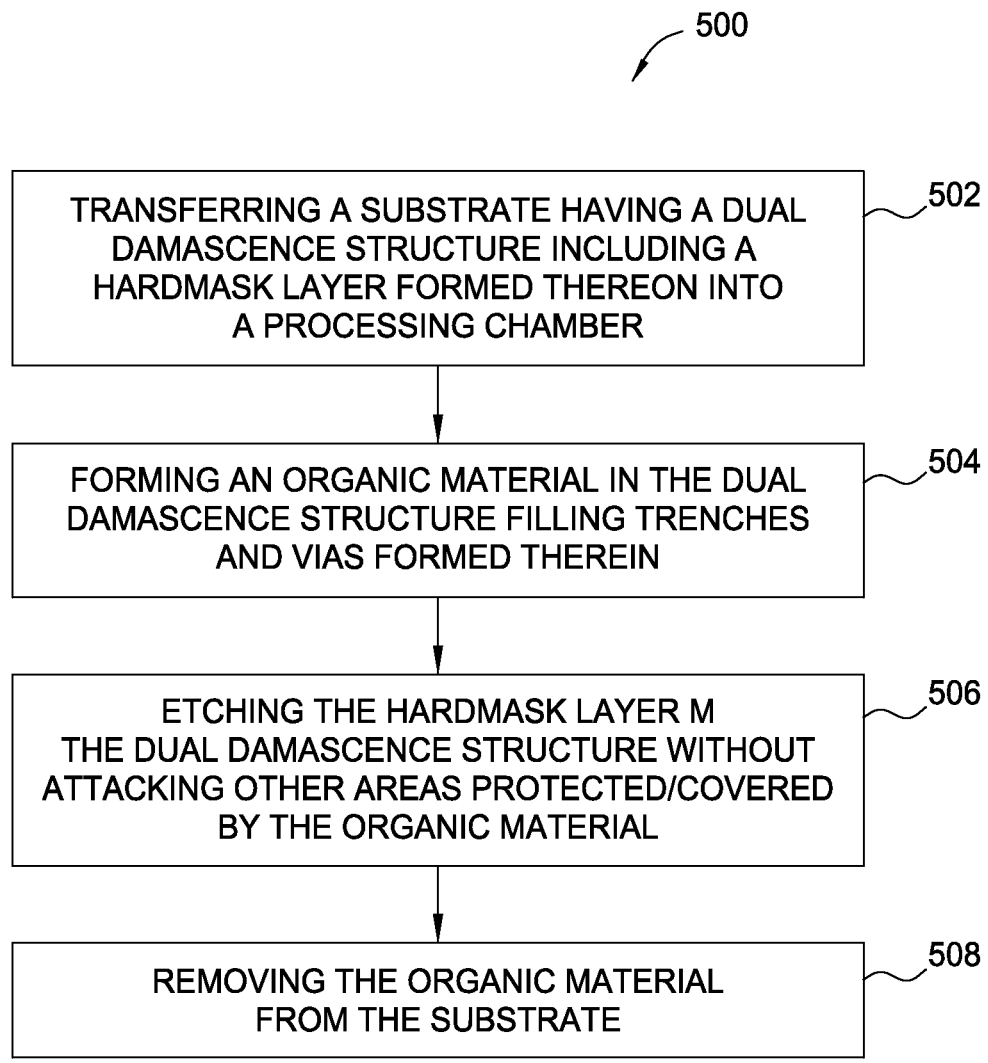
FIG. 5 depicts a flow diagram for forming a dual damascene structure process flow utilizing a selective protection process in accordance with one embodiment of the disclosure.

FIG. 5 illustrates a process sequence 500 used to manufacture a dual damascene structure using a selective protection process during a hardmask layer etching process. The sequence described in FIG. 5 corresponds to the fabrication stages depicted in FIGS. 6A-6D, which illustrates schematic cross-sectional views of a substrate 102 having a film stack 600 formed thereon, which may later be utilized to form a dual damascene structure during different stages of etching a hardmask layer 608.

Figure 6A:
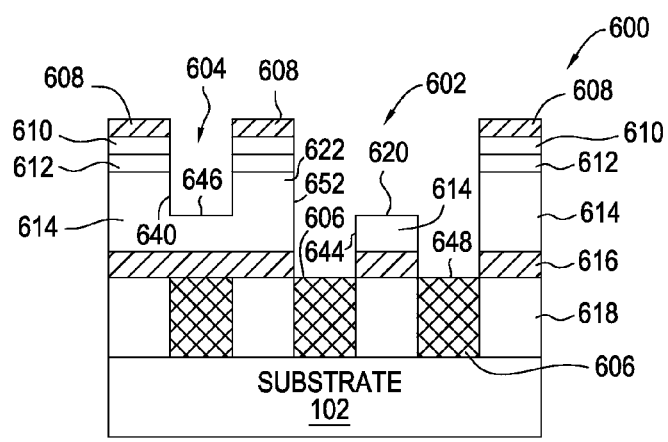
FIGS. 6A-6D depict cross-sectional views of a dual damascene structure over a sequence for a hardmask layer removal process in accordance with one embodiment of the present disclosure.

The process sequence 500 starts at block 502 by transferring a substrate, such as the substrate 102 depicted in FIG. 6A, into the processing chamber, such as the processing chamber 100 depicted in FIG. 1, or other suitable processing chamber. The substrate 102 may have a substantially planar surface, an uneven surface, or a substantially planar surface having a structure formed thereon. The substrate 102 shown in FIG. 6A includes the film stack 600 formed on the substrate 102, which may later be utilized to form a dual damascene structure. In one embodiment, the substrate 102 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 102 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the film stack 600 has multiple film layers that may be utilized to form an interconnection structure, such as a dual damascene structure, utilized in the back end semiconductor process. The film stack 600 includes a dielectric barrier layer 616 disposed on the substrate 102 above an insulating stack 618. The insulating stack 618, as shown in FIG. 6A, is disposed on the substrate 102 having a conductive layer 606, such as copper line, formed in and bounded by the insulating stack 618. The dielectric barrier layer 616 is disposed on the insulating stack 618 covering conductive materials of the conductive layer 606.

A dielectric bulk insulating layer 614 is disposed on the dielectric barrier layer 616 having a hardmask layer 608 disposed on optionally multiple capping layers, such as a first capping layer 610 stacked on a second capping layer 612. The hardmask layer 608 formed on the substrate 102 may serve as a mask layer during the subsequent etching/patterning process so as to efficiently transfer features, such as vias 604 and trenches 602, into the film stack 600. In one embodiment, the hardmask layer 608 as utilized here may be a metal dielectric layer, such as TiN, TaN, TiON, TaON, $Al_2O_3$, AlON, AlN or the like. In one particular embodiment, the hardmask layer 608 is a TiN layer or a TaN layer. The hardmask layer 608 may be formed by a chemical vapor deposition (CVD), atomic layer deposition (ALD), cyclical layer deposition (CLD), physical vapor deposition (PVD), or the like as needed.

As discussed above, the optional multiple capping layers include the first capping layer 610 on the second capping layer 612. The first capping layer 610 may be a TEOS layer, a silicon oxide layer or an amorphous carbon layer and the second capping layer 612 may be a low-k capping layer formed from a carbon-containing silicon oxide (SiOC), such as a BLACK DIAMOND® dielectric material available from Applied Materials, Inc.

The dielectric bulk insulating layer 614 and the insulating stack 618 are dielectric materials having a dielectric constant less than 4.0 (e.g., a low-k material). Examples of suitable materials include, silicon and carbon containing materials, carbon-containing silicon oxides (SiOC), such as BLACK DIAMOND® dielectric material and other low-k polymers, such as polyamides. The dielectric barrier layer 616 has a dielectric constant of about 5.5 or less. In one embodiment, the dielectric barrier layer 616 is a carbon containing silicon layer (SiC), a nitrogen doped carbon containing silicon layer (SiCN), a silicon nitride layer, a metal nitride or metal oxide, such as AlN or AlON, composite layers with multiple materials, combinations thereof, or the like. In the embodiment depicted in FIG. 6A, the dielectric barrier layer 616 is a SiCN film or a SiN film. An example of the dielectric barrier layer material is BLOK® dielectric material, available from Applied Materials, Inc. Another example of the dielectric barrier layer 616 may also be a PVD AlN and/or AlON, WN, CoN, also available from Applied Materials, Inc. Yet another example of the dielectric barrier layer 616 may also be an integrated bi-layer or multiple layer from the materials listed above including the BLOK® dielectric material and the PVD AlN and/or AlON, available from Applied Materials, Inc The conductive layer 606, such as copper materials, is present in the insulating stack 618.

In the embodiment depicted in FIG. 6A, the film stack 600 has previously undergone several processes including deposition, etching and patterning processes, wherein the description of these processes are eliminated herein for sake of brevity. These processes form the vias 604 and trenches 602 in the dielectric bulk insulating layer 614. In some embodiments, the barrier layer 616 has already been etched (also called a barrier layer open process), exposing an surface 648 of the underlying conductive layer 606 ready for a subsequent metallization processes performed to manufacture the interconnection structure. In other embodiment, the barrier layer 616 may remain on the substrate 102 and not be removed or etched from the substrate 102 until the hardmask layer 608 and/or the optional multiple capping layers are removed from the substrate 102 as needed. While removing the hardmask layer 608 from the substrate 102, aggressive etchants used to etch the hardmask layer 608 may as well as attack exposed surface, such as sidewalls 640, bottom 646 and exposed surfaces 648, 620 formed in the trenches vias 604 and trenches 602 unprotected/uncovered by the patterned hardmask layer 608. As such, the selective protection process, as described herein, may be utilized to protect these exposed areas unprotected/uncovered by the patterned hardmask layer 608 from being attacked or damaged during the hardmask layer etching process.

Figure 6B:
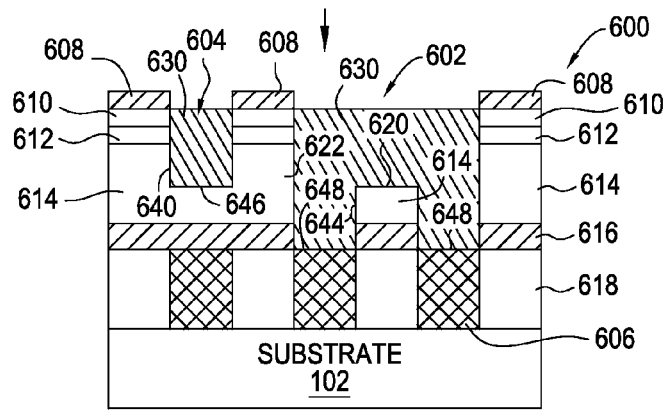

At block 504, a selective protection process is performed to form an organic polymer material 630 in the substrate 102, as depicted in FIG. 6B. The organic polymer material 630 may be formed on the non-planar substrate surface (i.e., with the vias 604 and trenches 602 formed in the film stack 600 of the substrate 102) with a sufficient thickness to substantially cover the exposed surfaces, including sidewalls 640, 642, 644 and bottoms/surfaces 646, 648 of the vias 604, trenches 602, and the conductive layer 606 to prevent attack during the subsequent etching process. Materials selected for the organic polymer material 630 may be a material that is flowable within certain temperature range, providing a self-leveling planarization property so as to fill in the uneven/non-planar structures (e.g., vias 604 and the trenches 602) formed on the substrate 102 and form a substantially planar surface only exposing the patterned hardmask layer 608 for etching. In one embodiment, the organic polymer material 630 may be formed filling the vias 604 and the trenches 602, predominantly only exposing the patterned hardmask layer 608 for the subsequently hardmask layer removal process. By doing so, the aggressive etchants used to etch the hardmask layer 608 may predominantly and mainly etch the hardmask layer 608 without attacking other areas (i.e., materials) on the substrate 102.

In one embodiment, the organic polymer material 630 may include a hydrocarbon containing material. The hydrocarbon material may have a formula of $C_xH_y$, wherein x and y are integers from 1 to 20. In one example, the organic polymer material 630 has a polymer-like cross-linking porogen structure.

In one embodiment, the organic polymer material 630 may be continually formed on the substrate 102 until the vias 604 and trenches 602 are filled with the organic polymer material 630, leaving only the hardmask layer 608 exposed for etching. As the geometry of the structures, e.g., vias 604 and trenches 602, are scaled down to nano-meter scale, the deposition process may be selected from a process that is capable of filling the vias 604 and trenches 602 with the organic polymer material 630 without creating defects, such as pores, voids, or holes. In one embodiment, the organic polymer material 630 may also be formed onto the substrate using hot wire CVD process, utilizing the processing chamber depicted in FIG. 1. Alternatively, the organic polymer material 630 may be formed by other suitable techniques, such as injection, spray deposition system, spray deposition system, aerosol deposition (AD) process, aerojet, nanoparticles spray from solution, spray CVD, ink-jet, meniscus coating, dip coating, electroplating, spray coating, electrospraying, screen printing, or by other suitable techniques as needed.

Figure 6C:
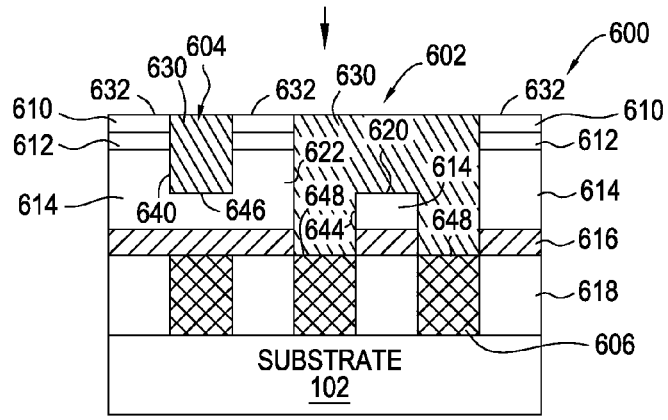
Figure 6D:
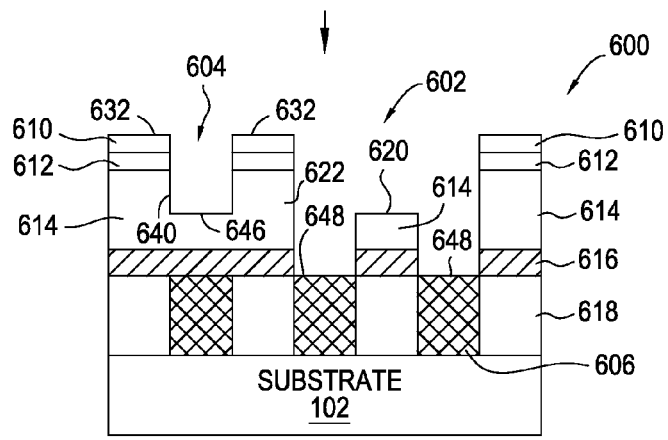

At block 506, a hardmask layer removal process is performed to remove the patterned hardmask layer 608 from the substrate 102, as depicted in FIG. 6C. With the protection provided from the organic polymer material 630, the structures on the substrate 102 will be substantially protected and pertained during the hardmask removal process with predominantly the patterned hardmask layer 608 being removed from the substrate 102, as shown in FIG. 6C. In one example, the hardmask layer 608 is a TiN or TaN layer.

The hardmask layer removal process may be performed by supplying an etching mixture into an etching processing chamber, such as the etching processing chamber 200 depicted in FIG. 2. The etching gas mixture is continuously supplied to etch the patterned hardmask layer 608 until the hardmask layer 608 is removed from the substrate 102.

In one embodiment, the etching gas mixture selected to etch the hardmask layer 608 includes at least a halogen containing gas. Suitable examples of the halogen containing gas includes sulfur hexafluoride ($SF_6$), carbon tetrafluoride ($CF_4$), hydrogen bromide (HBr), chlorine ($Cl_2$), $BCl_3$, $C_2F_4$, $C_4F_8$, $C_4F_6$, $CHF_3$, $CH_2F_2$, $CH_3F$, $NF_3$ or the like. In one particular embodiment, the halogen containing gas utilized to etch the hardmask layer 608 includes chlorine ($Cl_2$), $CH_4$, or combinations thereof.

While supplying the etching gas mixture, an inert gas may also be supplied into the etching gas mixture to assist the profile control as needed. Examples of the inert gas supplied in the gas mixture include Ar, He, Ne, Kr, Xe or the like. Some carrier gas, such as $O_2$, $N_2$, $N_2O$, $NO_2$, $NH_3$, or other suitable gases may also be supplied to the etching gas mixture as needed.

After the etching gas mixture is supplied to the processing chamber mixture, RF source power is supplied to form a plasma from the etching gas mixture therein. The RF source power may be supplied between about 400 Watts and about 2000 Watts and at a frequency between about 400 kHz and about 13.56 MHz. A RF bias power may also be supplied as needed. The RF bias power may be supplied at between about 0 Watts and about 500 Watts. In one embodiment, the RF source or bias power may be pulsed with a duty cycle between about 10 to about 95 percent at a RF frequency between about 500 Hz and about 10 kHz.

Several process parameters may also be controlled while supplying the etching gas mixture to perform the etching process. The pressure of the processing chamber may be controlled at between about 0.5 milliTorr and about 500 milliTorr, such as between about 5 milliTorr and about 100 milliTorr. A substrate temperature is maintained between about 15 degrees Celsius to about 300 degrees Celsius, such as greater than 50 degrees Celsius, for example between about 60 degrees Celsius and about 90 degrees Celsius. It is believed that high temperature, temperature greater than 50 degrees Celsius, helps reduce the amount of etching byproduct deposition on the substrate. The etching process may be performed for between about 5 seconds and about 120 seconds to etch the hardmask layer 608 with the thickness between about 50 Å and about 600 Å.

At block 508, after the hardmask layer 608 is removed from the substrate 102, the organic polymer material 630 may then be removed from the substrate 102 without damaging the structures formed on the substrate 102. In one embodiment, the organic polymer material 630 may be removed from the substrate 102 by using a UV thermal treatment process. The substrate 102 may be transferred to a processing chamber including a UV light source, such as the processing chamber 300 depicted in FIG. 3. UV light source may provide radiation, generating heat energy to evaporate, decompose or "burn out" the organic polymer material 630 from the substrate 102. The thermal energy provided from the UV radiation provides gentle heat energy to decompose the organic polymer material 630, forming volatile by-products in gas phase that are easily pumped out and removed from the processing chamber 300. In the embodiments wherein a post insulating material repair process is required, a process may be performed on the dielectric bulk insulating layer 614 to repair pores/damages, if any, formed after the etching/patterning process. The process performed at block 508 to remove organic polymer material 630 may be integratedly performed in the same chamber where the post insulating material repair process is performed to improve manufacturing cycle time and cost reduction.

In one embodiment, the UV thermal treatment process is performed by exposing the substrate under a UV thermal energy with or without a treatment gas. In embodiments wherein the treatment gas is utilized during the UV thermal treatment process, the treatment gas may be in the form of a gas or a vaporized liquid vapor that may assist reacting with and removing the organic polymer material 630 from the substrate 102. The treatment gas may be supplied toward the substrate 102 through the UV transparent gas distribution showerhead 310 from a region between a UV transparent window 308 and the UV transparent gas distribution showerhead 310, as shown in FIG. 3. The UV thermal treatment process is performed with the UV light source unit turned on, such as UV lamps 322, to assist dissociation and decomposition of chemical bonds with or without the treatment gas in the organic polymer material 630. The UV unit may be turned on prior to, while or after flowing the treatment gas into the processing chamber.

It is believed that the UV thermal energy provided from the UV radiation may efficiently evaporate the organic polymer material 630 into gas or vapor phase, which may be easily removed from the substrate surface and pumped out of the processing chamber. As the organic polymer material 630 often have a relatively lower evaporating point, such as less than 350 degrees Celsius, by utilizing a UV thermal energy from the UV radiation may ionize species from the organic polymer material 630 and promote continuing decomposition of the organic polymer material 630. In one embodiment, the wavelength of radiation from the UV light source may be selected to activate particular energy modes within the organic polymer material 630 on the substrate 102, so as to assist decomposing the organic polymer material 630. In some cases, the organic polymer material 630 may be decomposed by radiation by breaking bonds to form smaller molecules, radicals and/or ions, or electrons that may be removed from the substrate 102 in ion form. In the example of a hydrocarbon material, the carbon-carbon bonds (C—C) have energy of approximately 3.6 eV and the carbon-hydrogen bonds (C—H) have energy of approximately 4.2 eV. A photon having energy between about 2 eV and 4 eV may be utilized to activate or break carbon-carbon bonds (C—C) while having little effect on carbon-hydrogen bonds (C—H). Such energies correspond approximately to wavelengths of 300 nm to 600 nm. Photons of wavelength shorter/longer than 200 nm may activate or break carbon-hydrogen bonds (C—H).

The processing time for the UV thermal treatment process may be from about 15 seconds to about 900 seconds, for example about 60 seconds. During the thermal treatment process, the chamber pressure may be between about 500 milliTorr and about 30 Torr, for example about 7 Torr. The substrate may be heated to a temperature of about 50° C. to about 400° C., for example between about 200° C. and about 350° C., such as about 300° C. The flow rate of the treatment gas, if any, may be between about 50 mgm and about 3000 mgm, for example about 500 mgm. The electrode spacing (i.e., a distance between the showerhead 310 and the substrate support 324) may be between about 400 mils to about 1400 mils, for example about 900 mils. The UV power may be between about 100 W/cm$^2$ and about 2000 W/cm$^2$, for example about 1200 W/cm$^2$. The processing time for UV thermal energy process may be from about 15 seconds to about 900 seconds, for example about 360 seconds. During the process, the chamber pressure may be between about 50 milliTorr and about 500 Torr, for example about 20 Torr. The substrate may be heated to a temperature of about 50° C. to about 400° C., for example between about 200° C. and about 350° C., such as about 300° C. The flow rate of the treatment gas may be between about 100 mgm and about 2000 mgm, for example about 800 mgm, and the flow rate of the carrier gas may be between about 500 sccm to about 5000 sccm, for example about 2000 sccm. The electrode spacing (i.e., a distance between the nozzle 214 and the substrate support pedestal 235) may be between about 400 mils to about 1400 mils, for example about 900 mils. The UV power may be between about 100 W/cm$^2$ and about 2000 W/cm$^2$, for example about 1200 W/cm$^2$. In one particular embodiment, the UV light source provides a radiation having a wavelength between about 150 nm and about 800 nm to remove the organic polymer material 630 from the substrate 102. The UV power may be between about 800 W/cm$^2$ and about 1500 W/cm$^2$.

It is noted that the each processes described in blocks 502, 504, 506, 508 may be performed in different processing chambers or the same processing chambers all integrated and incorporated in cluster system, such as the system 400 depicted in FIG. 4 without breaking vacuum and transferring the substrate to an atmosphere environment.

Thus, methods and apparatuses for forming a dual damascene structure utilizing a selective protection process to protect vias and/or trenches in the dual damascene structure while removing a patterned hardmask layer are provided. The selective protection utilizes an organic polymer materials filled in vias/trenches in the dual damascene structure, providing a protection to the areas uncovered/unprotected by the patterned hardmask layer from being attacked or damaged during the hardmask layer removal process. By doing so, certain areas in the dual damascene structure may be selectively protected during the hardmask removal process, so that the likelihood of the damage made to the dual damascene structure during the hardmask layer removal process may be reduced or eliminated, thus increasing electrical performance of devices having the dual damascene structure.

While the foregoing is directed to embodiments of the present disclosure, other and further embodiments can be devised without departing from the basic scope thereof, and the scope thereof is determined by the claims that follow.

The invention claimed is:

1. A method for removing a patterned hardmask layer from a substrate, comprising:
forming an organic polymer material on a dual damascene structure on a substrate that exposes substantially a patterned hardmask layer disposed on an upper surface of the dual damascene structure, wherein the dual damascene structure comprises a bulk insulating layer disposed below the patterned hardmask layer, the bulk insulating layer having vias or trenches defined in the bulk insulating layer having the organic polymer material filled into the vias or trenches, wherein the bulk insulating layer is a silicon and carbon containing material;
removing the patterned hardmask layer on the substrate; and
removing the organic polymer material from the substrate.

2. The method of claim 1, wherein the organic polymer material is a hydrocarbon material.

3. The method of claim 1, wherein removing the hardmask layer further comprises:
predominantly etching the patterned hardmask layer relative to the organic polymer material, the organic polymer material protecting some areas of the dual damascene structure uncovered by the patterned hardmask layer.

4. The method of claim 1, wherein removing the organic polymer material from the substrate comprises:
exposing the substrate to UV radiation.

5. The method of claim 4, wherein the UV radiation has a wavelength between about 150 nm and about 800 nm.

6. The method of claim 4, further comprising:
decomposing the organic polymer material.

7. The method of claim 4, removing the organic polymer material from the substrate comprises:
maintaining a substrate temperature between about 200 degrees Celsius and about 400 degrees Celsius.

8. The method of claim 1, wherein forming the organic polymer material further comprises:
performing a chemical vapor deposition process to form the organic polymer material on the substrate.

9. The method of claim 8, wherein the chemical vapor deposition process is a hot wire chemical deposition process.

10. The method of claim 1, wherein the patterned hardmask layer is a TiN or TaN layer.

11. A method for removing a patterned hardmask layer from a substrate, comprising:
disposing an organic material layer in a structure defining an uneven top surface of a substrate, the organic polymer material layer filling the structure to provide a substantially planar surface predominantly exposing a patterned hardmask layer on the substrate;
removing the patterned hardmask layer from the substrate; and thermally treating the substrate after the patterned hardmask layer is removed.

12. The method of claim 11, wherein thermal treating the substrate further comprises:
exposing the substrate to a UV radiation.

13. The method of claim 12, wherein the UV radiation has a wavelength between about 150 nm and about 800 nm.

14. The method of claim 12, wherein exposing the substrate to the UV radiation further comprising:
decomposing the organic polymer material layer.

15. The method of claim 11, wherein disposing the organic polymer material further comprising:
performing a chemical vapor deposition process to form the organic polymer material into the structure.

16. The method of claim 15, wherein the organic polymer material is filled into vias or trenches formed in the structure.

17. The method of claim 11, wherein the organic polymer material is a hydrocarbon material.

18. A method for removing a patterned hardmask layer from a substrate, comprising:
selectively covering a first portion of a structure disposed on a substrate by an organic polymer material, wherein the first portion comprises vias or tranches formed in a bulk insulating material in a dual damascene structure, wherein the organic polymer materials is filled in the vias or trenches, and exposing a second portion of the structure on the substrate, wherein the second portion includes a patterned hardmask layer disposed on the structure;
removing the patterned hardmask layer from the structure while the organic polymer material remains covering the first portion of the structure; and
UV radiation treating the substrate to remove the organic polymer material from the structure.

* * * * *

UNITED STATES PATENT AND TRADEMARK OFFICE
CERTIFICATE OF CORRECTION

PATENT NO. : 9,269,563 B2
APPLICATION NO. : 14/298102
DATED : February 23, 2016
INVENTOR(S) : Ren et al.

Page 1 of 1

It is certified that error appears in the above-identified patent and that said Letters Patent is hereby corrected as shown below:

In the Claims:

Column 14, Claim 11, Line 61, please insert -- polymer -- after organic;

Column 16, Claim 18, Line 5, please delete "tranches" and insert -- trenches -- therefor.

Signed and Sealed this
Thirty-first Day of May, 2016

Michelle K. Lee
*Director of the United States Patent and Trademark Office*